(12) United States Patent
Sakakibara

(10) Patent No.: US 6,404,167 B1
(45) Date of Patent: Jun. 11, 2002

(54) BATTERY CHARGING DEVICE

(75) Inventor: Kazuyuki Sakakibara, Anjo (JP)

(73) Assignee: Makita Corporation (JP)

(*) Notice: Subject to any disclaimer, the term of this patent is extended or adjusted under 35 U.S.C. 154(b) by 0 days.

(21) Appl. No.: 09/710,550

(22) Filed: Nov. 9, 2000

(30) Foreign Application Priority Data

Nov. 10, 1999 (JP) .......................................... 11-319676

(51) Int. Cl.[7] ................................................ H02J 7/00
(52) U.S. Cl. ...................................... 320/132; 320/130
(58) Field of Search ............................... 320/132, 130, 320/134, 149; 324/426, 431, 433

(56) References Cited

U.S. PATENT DOCUMENTS

| | | | |
|---|---|---|---|
| 4,308,493 A | 12/1981 | Köthe et al. ................. 320/152 |
| 4,370,606 A | 1/1983 | Kakumoto et al. .......... 320/141 |
| 5,241,259 A | 8/1993 | Patino et al. ................ 320/150 |
| 5,480,734 A | 1/1996 | Schulz et al. .................... 429/7 |
| 5,497,068 A | 3/1996 | Shiojima ......................... 320/35 |
| 5,545,969 A | * 8/1996 | Hasegawa .................... 320/134 |
| 5,652,500 A | 7/1997 | Kadouchi et al. .............. 320/15 |
| 5,659,239 A | 8/1997 | Sanchez et al. ............. 320/150 |
| 5,739,673 A | 4/1998 | Le Van Suu ................... 320/31 |
| 5,886,527 A | 3/1999 | Ito .............................. 324/431 |
| 5,909,101 A | 6/1999 | Matsumoto et al. ........ 320/110 |
| 5,912,547 A | 6/1999 | Grabon ....................... 320/150 |
| 6,008,628 A | 12/1999 | Brotto ......................... 320/137 |
| 6,060,862 A | * 5/2000 | Sase et al. ................... 320/132 |
| 6,075,347 A | 6/2000 | Sakakibara .................. 320/150 |
| 6,124,698 A | 9/2000 | Sakakibara .................. 320/110 |
| 6,133,713 A | 10/2000 | Brotto ......................... 320/150 |

FOREIGN PATENT DOCUMENTS

| | | |
|---|---|---|
| EP | 0621990 | 6/1996 |
| JP | 04351488 A | 12/1992 |
| JP | 05244729 A | 8/1993 |
| JP | 06121468 A | 4/1994 |
| JP | 07007865 A | 1/1995 |
| JP | 07123604 A | 5/1995 |
| JP | 07153497 A | 6/1995 |
| JP | 07284235 A | 10/1995 |
| JP | 18298140 A | 11/1996 |
| JP | 08327711 A | 12/1996 |
| JP | 08164597 A | 1/1998 |
| WO | WO 91/08604 | 6/1991 |
| WO | WO 95/09471 | 4/1995 |

* cited by examiner

*Primary Examiner*—Peter S. Wong
*Assistant Examiner*—Lawrence Luk
(74) *Attorney, Agent, or Firm*—Welsh & Katz, Ltd.; Thomas W. Tolpin

(57) ABSTRACT

The battery charging device obtains an open-circuit voltage at the time of 70% capacity based on information stored in a ROM of a battery package prior to the charge, and upon measuring an open-circuit voltage of the battery package by a voltage measuring portion, if this open-circuit voltage is higher than the obtained open-circuit voltage, a second indicator is switched ON to indicate that the remaining capacity is not less than 70% to thereby enable discrimination among batteries requiring charge or that do not prior to starting charging.

7 Claims, 5 Drawing Sheets

FIG. 5

| dT/dt | \|T\| | | | | | |
|---|---|---|---|---|---|---|
| | ~$T_1$ | $T_1$~$T_2$ | $T_2$~$T_3$ | $T_3$~$T_4$ | $T_4$~$T_5$ | $T_5$~ |
| ~$X_1$ | $I_{11}$ | $I_{12}$ | $I_{13}$ | $I_{14}$ | $I_{15}$ | $I_{16}$ |
| $X_1$~$X_2$ | $I_{21}$ | $I_{22}$ | $I_{23}$ | $I_{24}$ | $I_{25}$ | $I_{26}$ |
| $X_2$~$X_3$ | $I_{31}$ | $I_{32}$ | $I_{33}$ | $I_{34}$ | $I_{35}$ (1) | $I_{36}$ |
| $X_3$~$X_4$ | $I_{41}$ | $I_{42}$ | $I_{43}$ | $I_{44}$ | $I_{45}$ (2) | $I_{46}$ |
| $X_4$~$X_5$ | $I_{51}$ | $I_{52}$ | $I_{53}$ | $I_{54}$ | $I_{55}$ | $I_{56}$ |
| $X_6$~ | $I_{61}$ | $I_{62}$ | $I_{63}$ (3) | $I_{64}$ | $I_{65}$ | $I_{66}$ |

M1

BATTERY CHARGING DEVICE

BACKGROUND OF THE INVENTION

The present invention relates to a battery charging device capable of charging a plurality of batteries with a single device.

Battery packages accumulating rechargeable batteries that can be repeatedly used are recently being employed as power sources of power tools. By providing a plurality of such battery packages, the power tools may be successively used.

However, in case the battery packages are used by a plurality of numbers, it may happen that one cannot distinguish whether each of these are charged or run down battery packages. It may thus happen that already charged battery packages are again charged to thereby shorten the life of the batteries and to unnecessarily lengthen the time for charging. On the other hand, in case run down batteries are left uncharged, operations using power tools may be interrupted owing to battery exhaustion.

In order to cope with such problems, it has been materialized for a method of discriminating capacities of battery packages by mounting ICs for detecting and integrating charge/discharge currents within battery packages. However, mounting ICs to each battery package caused increases in costs and also lead to large-sized battery packages.

The present invention has been made for the purpose of solving the above subjects, and it is an object thereof to provide a battery charging device capable of displaying that a capacity of batteries is not less than a specified level without mounting ICs to battery packages for current detection.

BRIEF SUMMARY OF THE INVENTION

In order to achieve the above purpose, a battery charging device according to the present invention is characterized by comprising:

judging means for judging, prior to start of charge, whether an open-circuit voltage of batteries is higher than a specified value, and indicating means for indicating that a capacity of the batteries is not less than a prescribed value in case the battery voltage is higher than the specified value.

In a battery charging device, it is determined whether an open-circuit voltage provided by batteries is higher than a specified value, and in case the voltage of the batteries is higher than the specified value, it is displayed that a capacity of the batteries is not less than a prescribed value. It is thereby possible to discriminate before starting charge whether the batteries need to be charged or whether they do not.

A battery charging device according to the present invention is characterized by comprising:

an open-circuit voltage obtaining means for obtaining, based on an identifier provided on the battery side, an open-circuit voltage at the time the battery capacity is not less than a specified value, judging means for judging, prior to start of charge, whether a measured open-circuit voltage of batteries is higher than the open-circuit voltage as obtained by the open-circuit voltage obtaining means, and indicating means for indicating that a capacity of the batteries is not less than a prescribed value in case the measured open-circuit voltage is higher than the obtained open-circuit voltage.

In a battery charging device, it is determined whether an open-circuit voltage provided by batteries is higher than a specified value, and in case the voltage of the batteries is higher than the specified value, it is displayed that a capacity of the batteries is not less than a prescribed value. It is thereby possible to discriminate before starting charge whether the batteries need to be charged or whether they do not. On the other hand, by acquiring an open-circuit voltage when the capacity of the batteries is not less than the specified value on a basis of an identifier provided on the battery side, it is enabled to determine whether the batteries of various voltages satisfy a specified capacity or not.

A battery charging device according to the present invention is characterized by comprising:

a memory means for storing maps, which are maps that are obtained through mapping based on temperatures and values of rises in temperature of batteries to obtain a permissible current value at which charge may be performed while restricting a rise in temperature of batteries, for setting the permissible current value to be small in case the temperature value is high and setting the permissible current value to be small in case the temperature rising value is low, a temperature detecting portion for detecting a present temperature of the batteries, a temperature rising value outputting means for obtaining the temperature rising value from the temperature as detected by the temperature detecting portion, a permissible current value retrieving portion for retrieving maps in the memory means for obtaining the permissible value based on the temperature as detected by the temperature detecting portion and the temperature rising value output by the temperature rising value outputting means, a charging portion for charging the batteries at the permissible current as retrieved by the permissible current value retrieving portion, a capacity judging portion for judging whether the batteries have been charged up to a specified capacity on a basis of judgments whether a number of times in which the temperature as detected by the temperature detecting portion and the temperature rising value output by the temperature rising value outputting means fall within regions indicating a final stage of charge from among the map of the memory means is frequent or not, and indicating means for indicating that a capacity of the batteries is not less than a prescribed value based on the judgments of the capacity as obtained by the capacity judging portion.

In a battery charging device, a permissible current value at which charge may be performed while restricting a rise in temperature of batteries is obtained by using a map that is obtained through mapping temperature values of batteries and values of rises in temperature of batteries. More particularly, a map is retrieved based on temperatures and values of rises in temperature of batteries to obtain a permissible current value at which charge may be performed while restricting a rise in temperature of a battery, and the batteries are charged at the permissible current value. It is accordingly possible to charge batteries, which temperatures are apt to rise at the time of charging, in a short time while causing no degradations owing to rises in temperature.

It is particularly possible to perform accurate determination without being affected through periphery temperatures or the like since it is determined whether the capacity of the batteries is not less than the prescribed value by using the map for determining whether a number of times in which the temperature rising value is relatively high and in which relatively small permissible current values are output is frequent or not, that is, whether the rise in temperature is high and whether the rise in temperature is still being high also when setting a value of charge current to be small.

In accordance with the more preferred teaching of the present invention, the battery charging device is further characterized by comprising: an integrating means for integrating charge currents to the batteries, and an integrated value judging means for judging whether charge has been performed up to a specified capacity by the integrating means, wherein one of the indicating means indicates that a capacity of the batteries is not less than a prescribed value in case it is judged by the integrated value judging means that charge has been performed up to the specified capacity.

In a battery charging device, it is being displayed that the capacity of the batteries is not less than the prescribed value by integrating the amount of charge current to the batteries so that it is possible to reliably perform display.

A battery charging device according to the present invention is characterized by comprising:

a charge amount storage means for storing charge amounts to a memory means of the batteries during charging, judging means for judging, prior to start of charge, whether an open circuit voltage of batteries is higher than a specified value, and indicating means for indicating that a capacity of the batteries is not less than a prescribed value in case the battery voltage is higher than the specified value and the charge amount as stored in the memory means is high, and for indicating that a capacity of the batteries is not more than the prescribed value in case the charge amount as stored in the memory means is low though the battery voltage is higher than the specified value.

In a battery charging device, charge amounts are stored in a memory device of the batteries during charging. Prior to starting charge, in case a voltage of the batteries is higher than a specified value and the amount of charge stored in the memory device is high, it is displayed that the battery capacity is not less than a prescribed value. On the other hand, in case the battery voltage is higher than the specified value but the amount of charge stored in the memory device is low, it is displayed that the battery capacity is the prescribed value or less. It is therefore possible to appropriately display that the battery capacity is the prescribed value or less even immediately after the batteries have been charged for a short time and the battery voltage has thus been temporarily increased.

BRIEF DESCRIPTION OF THE DRAWINGS

FIG. 5 is an explanatory view showing contents of a map stored in the control circuit of the first embodiment.

DETAILED DESCRIPTION OF THE INVENTION

The battery charging device according to a preferred embodiment of the present invention will now be explained with reference to the drawings.

Figure 1:
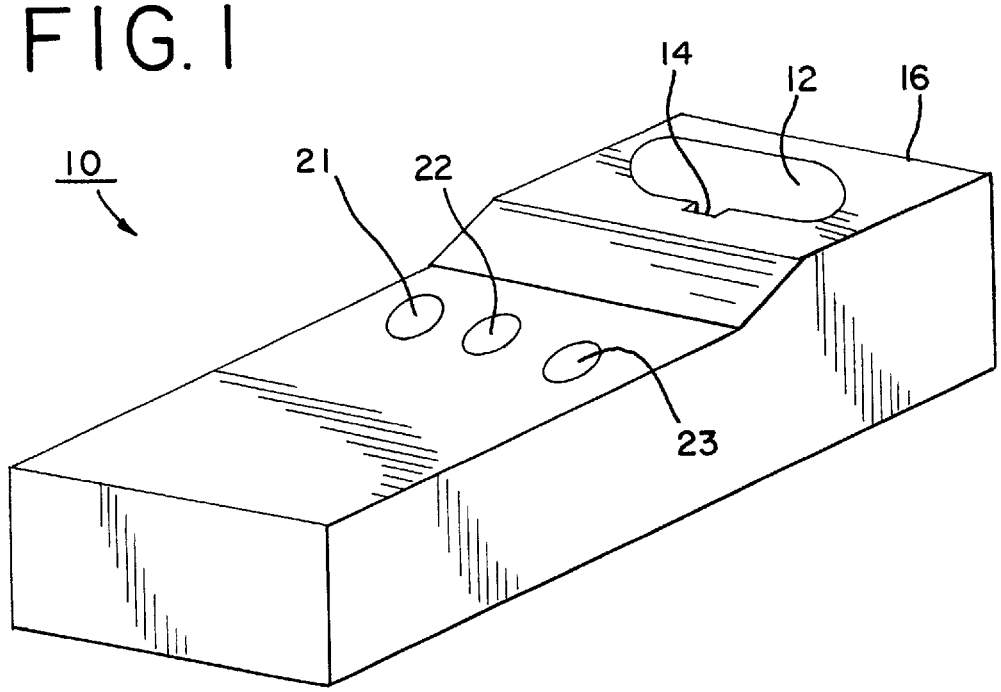
FIG. 1 is a perspective view of a battery charging device according to one embodiment of the present invention.
Figure 2:
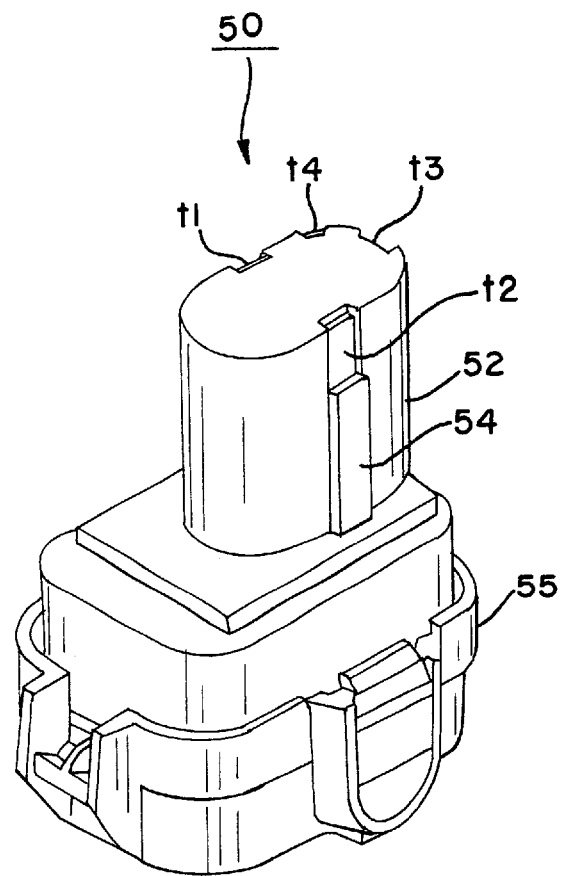
FIG. 2 is a perspective view of a battery package according to the embodiment of the present invention.
Figure 3:
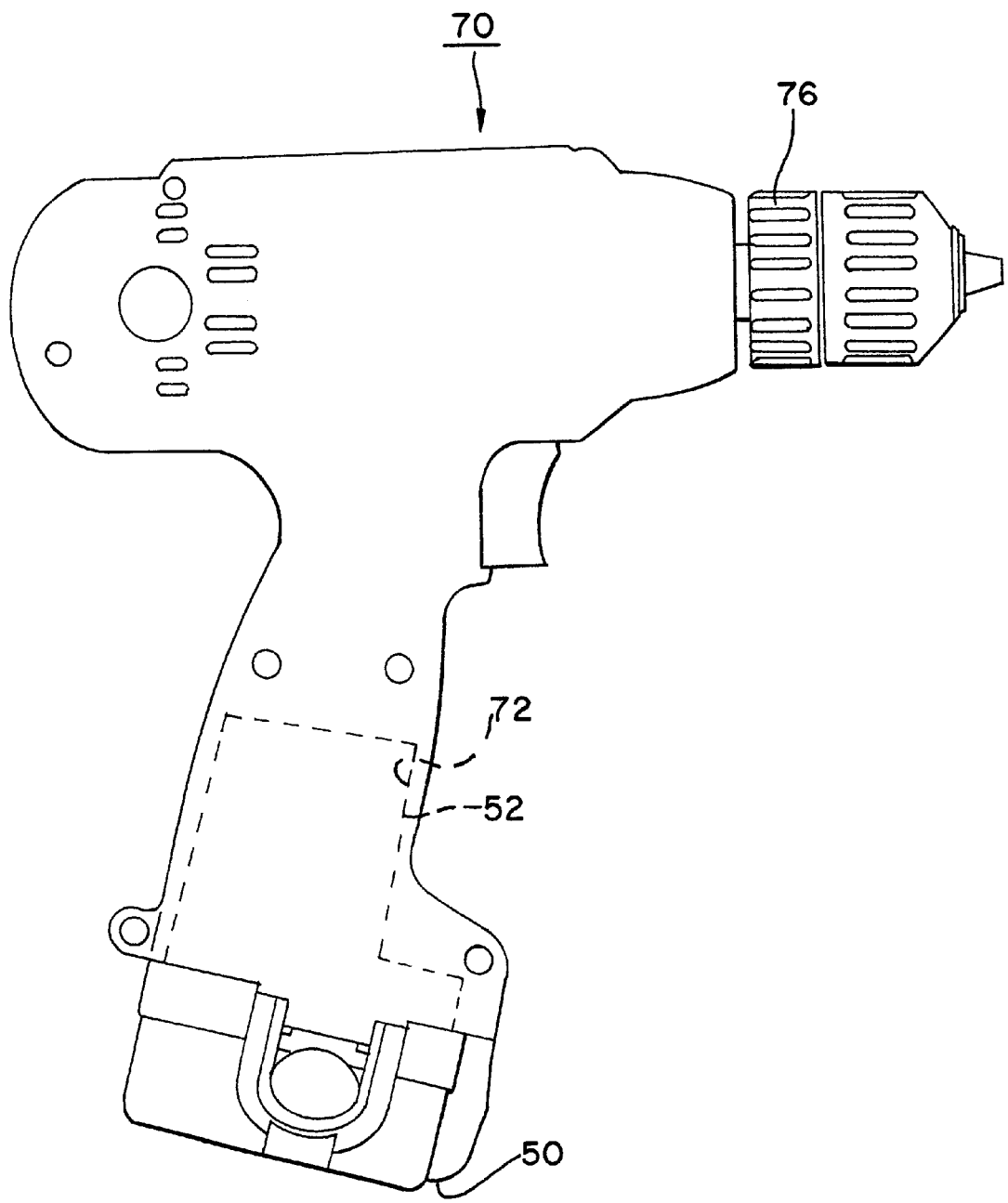
FIG. 3 is a front view of a battery-driven drill employing the battery package as illustrated in FIG. 2.

FIG. 1 illustrates a battery charging device 10 according to one embodiment of the present invention, FIG. 2 a battery package 50 that is charged by the battery charging device 10, and FIG. 3 a battery-driven drill 70 that is driven by the battery package 50.

As illustrated in FIG. 2, the battery package 50 incorporating therein nickel-metal hydride batteries is comprised of a fitting portion 52 formed to assume a substantially cylindrical shape and a base portion 55 formed to assume a substantially prism-like shape, wherein a key-shaped key portion 54 is formed on a lateral side of the fitting portion 52 while a first terminal t1 connected to positive pole sides of the batteries, a second terminal t2 connected to negative pole sides, and a third terminal t3 and a fourth terminal t4 connected to a ROM (to be described later) are respectively formed on an upper portion of the fitting portion 52.

As illustrated in FIG. 1, the battery charging device 10 for charging the battery package 50 is formed with a fitting hole 12 for fitting the fitting portion 52 of the battery package 50 therein, and a key groove 14 is formed on a lateral wall of the fitting hole 12 for introducing the key portion 54 of the fitting portion 52 therein. The fitting hole 12 is integrally formed with a box body 16 comprising the battery charging device 10 through resin. In the illustrated embodiment, the provision of the key portion 54 formed in the fitting portion 52 of the battery package 50 and the key groove 14 formed in the fitting hole 12 of the battery charging device 10 make it possible to prevent the battery package 50 from being attached in an erroneous direction. For this purpose, first to fourth terminals (not shown) are formed on a bottom portion of the fitting hole 12 for abutting the first to fourth terminals t1, t2, t3 and t4 of the battery package 50. A first indicator 21, a second indicator 22 and a third indicator 23, which are comprised of LED lamps for displaying a battery capacity, are formed on an upper portion of the battery charging device 10. Here, the first indicator 21 is for indicating that the capacity of the battery package is not more than 70%, the second indicator 22 that the capacity is not less than 70%, and the third indicator 23 that charge has been completed.

As illustrated in FIG. 3, the battery-driven drill 70 is formed with a fitting hole 72 for fitting the fitting portion 52 of the battery package 50 therein, and is arranged to rotate a chuck 76 through a motor (not shown) upon supply of electric power from the first terminal t1 and the second terminal t2 of the battery package 50. When using the battery-driven drill 70, successive operation is enabled by sequentially using one battery package 50 of which charge has completed among a plurality of battery packages 50.

Figure 4:
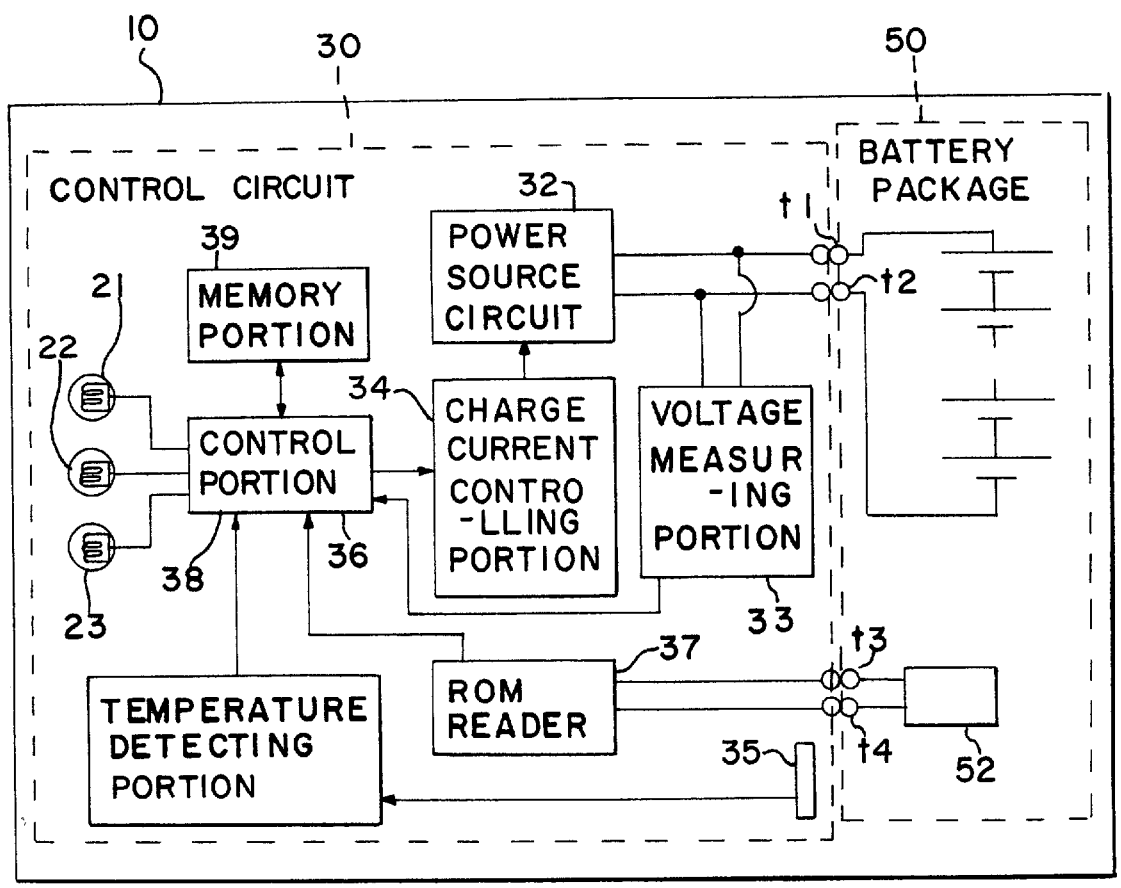
FIG. 4 is a block diagram showing a control circuit for the battery charging device as illustrated in FIG. 1.

FIG. 4 illustrates an arrangement of a control circuit 30 provided within the battery charging device 10 and that of the battery package 50. The battery package 50 is capable of outputting a voltage of 9.6 V between the first terminal t1 and the second terminal t2 by accumulating therein eight (8) nickel-metal hydride batteries of 1.2 V. An EEPROM 52 is further provided within the battery package 50 in to which EEPROM 52 a type of batteries (nickel-metal hydride batteries), nominal voltage (9.6 V), nominal capacity (3 Ah) and an approximate amount of charge (value of indicator) are written.

On the other hand, the control circuit 30 of the battery charging device 10 is comprised of the following: a temperature detecting portion 38 for detecting a temperature of the batteries based on an output value of a temperature sensor (thermistor) 35; a memory portion 39 for storing information for controlling current values in form of maps or the like (to be described later); a control portion 36 for obtaining a temperature rising value by differentiating the temperature value as output by the temperature detecting portion 38, obtaining a current value at which charge may be performed while restricting the temperature rising value, and outputting the current value as a current command value to a charge/discharge current controlling portion 34; a charge/discharge current controlling portion 34 for controlling a power source circuit 32 based on the current command value from the control portion 36 and for adjusting a charge current for the batteries; a power source circuit 32 for performing charge by impressing voltage between the first terminal t1 and the second terminal t2 of the battery package 50; a ROM reader 37 for reading contents of the EEPROM 52 on the battery package 50 side; and a voltage measuring portion 33 for measuring an open-circuit voltage of the battery package 50. The first, second and third indicators 21, 22, 23 as explained above with reference to FIG. 1 are connected to the control portion 36.

In the battery charging device 10 of the illustrated embodiment, it is displayed whether the battery package 50 needs to be charged prior to performing charge. More particularly, the open-circuit voltage of the battery package 50 is measured by the voltage measuring portion 33, and in case the open-circuit voltage is higher than a specified value, it is determined that the remaining capacity is not less than 70% and the second indicator 22 is switched ON accordingly. Though of batteries comprising the battery package may be different (nickel-metal hydride batteries and nickel-cadmium batteries or the like may be used in combination) and nominal voltages of the batteries may also be different, an open-circuit voltage at the time the capacity is not less than 70% is obtained based on information stored in the EEPROM 52 of the battery package for determining the remaining capacity.

The battery charging device 10 further integrates charge currents, and in case the integrated value reaches 70% of the nominal capacity as stored in the EEPROM 52 of the battery package, the second indicator 22 is switched ON.

Still further, all of the actions of the battery charging device 10 of performing control of the charge current, determining whether 70% of the capacity has been reached, and detecting that charge has completed are performed on a basis of a map. The arrangement of such a map as employed for controlling current will now be explained with reference to FIG. 5.

It is generally the case with batteries that by setting the charge current to be large, it is possible to shorten the time for charge but the rise in temperature will be large. On the other hand, in case the charge current is set to be small, the rise in temperature will be small while the time for charge will become longer. Particularly nickel-metal hydride batteries exhibit characteristics that temperature gradients (temperature rising values) are largely varied depending on charge currents or already charged capacities. In view of this fact, charge is performed in the illustrated embodiment by varying current values for restricting rises in temperature. More particularly, while charge had been performed at constant current values in conventional battery charging devices, charge is performed in the battery charging device of the illustrated embodiment by determining conditions of the batteries on a basis of an absolute temperature and temperature rising values and at a maximum current that may be supplied while restricting rises in temperature of the batteries, that is, by varying current values in accordance with conditions of the batteries.

Here, in case the temperature of the batteries is high, a relatively small charge current is supplied, and on the other hand, in case the temperature is low, a relatively large charge current is supplied. Further, in case the rise in temperature is large, a relatively small charge current is supplied while a relatively large charge current is supplied when the rise in temperature is small.

The map is for performing variable control of the above current, and is for defining optimal current values that may be supplied while restricting rises in temperature of the batteries, obtained by taking absolute values T of the batteries on lateral rows and changes in temperature dT/dt on the vertical columns. More particularly, in case the temperature of the battery is high and the rise in temperature is large (lower right in the map), a relatively small charge current is supplied, and in case the temperature of the battery is high and the rise in temperature is small (upper right in the map), a medium charge current is supplied. In case the temperature of the battery is low and the rise in temperature is large (lower left in the map), a medium charge current is supplied, and in case the temperature of the battery is low and the rise in temperature is small (upper left in the map), a relatively large charge current is supplied. In other words, optimal current values are set for each of the regions of the map to satisfy both, a target time for charge (approximately 20 minutes) and a target temperature to be reached.

It is preferable to set a small current value on the left column of the map for preventing degradations in performance that are apt to occur when charge is performed at large current in case the temperature is low (not more than 0° C.).

Based on this map, a suitable region is retrieved at the time of performing charge on based on the absolute temperature T of the batteries and the temperature changes dT/dt for controlling the charge current on the basis of the current value defined for the specific region. For instance, in case the temperature of the batteries exists between T3 and T4, and the temperature change of the battery (temperature rising value) between X1 and X2, the current value of region I24 is output.

The battery charging device of the illustrated embodiment further detects, based on movements of regions within the map, that charge has been performed up to a specified capacity, and that charge has been completed. It was conventionally the case that completion of charge was detected by observing the temperature or voltage while setting the charge current to be constant. More particularly, it was determined that charge has been performed up to a specified capacity by an elapse of a specified time from the start of charge. On the other hand, completion of charge was determined on the basis of temperature rising values, changes in voltage values and further on decreases in voltage upon fully charging. However, it is impossible to determine whether charge has been performed up to a specified capacity based on the time for charging alone since the charge current is varied in the battery charging device of the illustrated embodiment. It is similarly impossible to detect completion of charge by merely observing temperatures, temperature changing values or voltages and voltage changing values as in the prior art. Thus, it is determined whether the battery capacity has been reached and charge has been completed on the basis of movements of regions within the map.

While charge is being performed, it seems that movements among regions are randomly performed based on variations in temperature and temperature rising values. More particularly, prior to fully charging, a relatively small region, that is, the region on the lower right of the map of FIG. 5 is selected for the charge current in case the temperature is high or the rise in temperature is large, whereupon the current is decreased to make the rise in temperature smaller and finally comes to correspond to an upper region of the illustrated map.

However, when the batteries come closer to full charge, the temperature rising value becomes larger as it is characteristic for nickel-metal hydride batteries. Thus, since the rise in temperature is large, a lower region is selected from among the illustrated map so that the temperature rise remains large while charge is performed at relatively small current. Based on this principle, measurements are performed in the battery charging device of the illustrated embodiment at specified cycles (for instance, at intervals of several hundred seconds), and in case a number of times in which regions, as indicated by the hatchings in the illustrated map in which the rise in temperature is large and in regions in which the temperature is high and the rise in temperature is medium, has become frequent, it is determined that charge has been performed to a specified capacity (70%), and in case the frequency becomes even higher, it is determined that charge has been completed (100% of capacity).

In the battery charging device, regions of maps are assigned with weight for appropriately determining that the charge capacity has been reached and that charge has been completed. More particularly, when regions (1) I42, I43, I34, I35, I36 that are apt to occur at an initial stage of completion of charge are entered, "1" is increment, when regions (2) I51, I52, I53, I44, I45, I46, I54, I55, I56 that are apt to occur at a medium stage of completion of charge are entered, "2" is increment, and when regions (3) I61, I62, I63, I64, I65, I66 that are apt to occur at a final stage of completion of charge are entered, "3" is increment for respectively detecting that charge has been accurately performed up to the target capacity.

Figure 6:
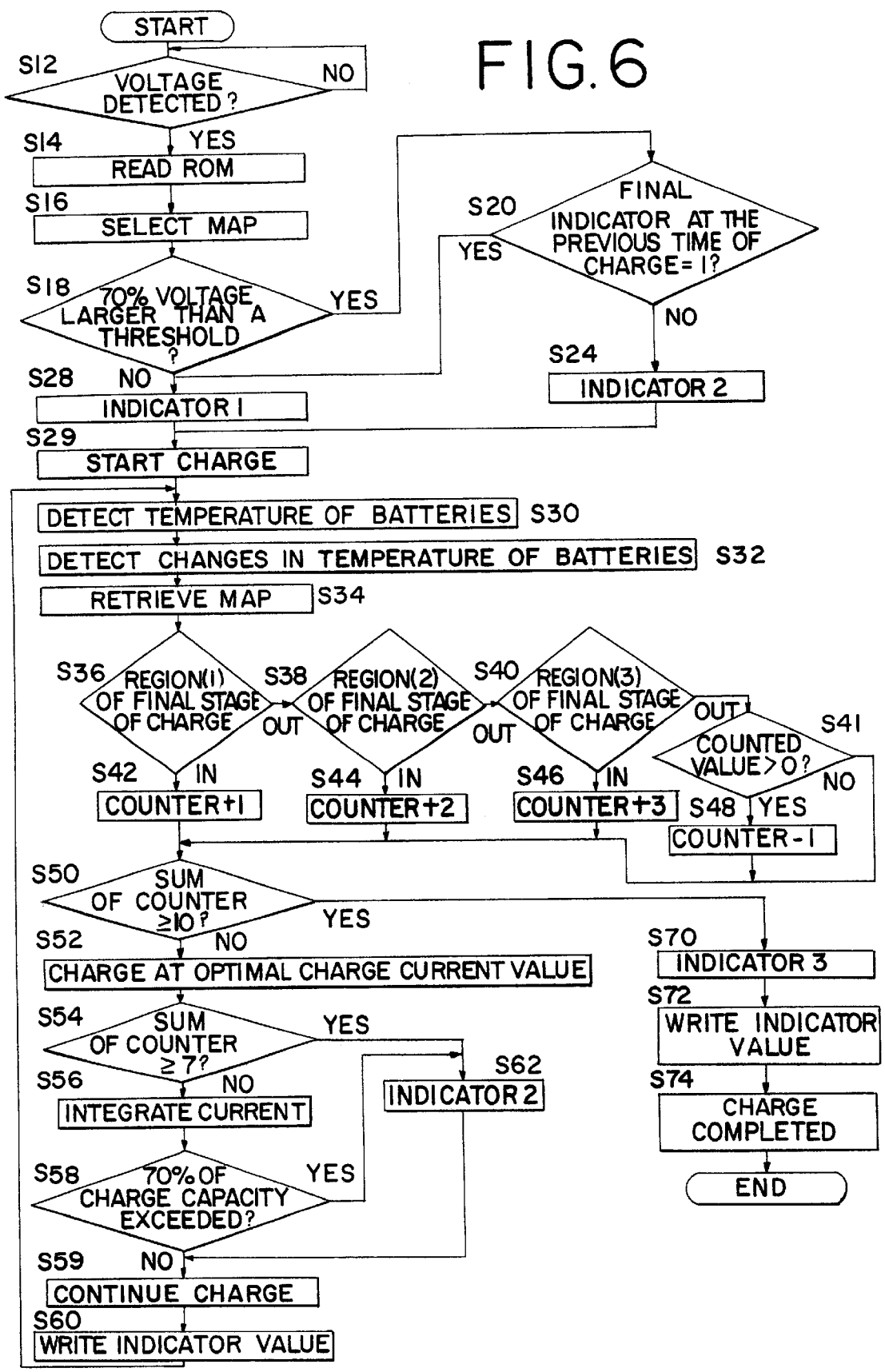
FIG. 6 is a flowchart showing processes performed in the control circuit of the first embodiment.

Concrete processes performed in the battery charging device of the illustrated embodiment will now be explained based on the flowchart of FIG. 6.

The control portion 36 of the control circuit (see FIG. 4) observes, by observing the voltages of the terminals T1, T2 through the voltage measuring portion 33, whether the battery package 50 has been attached (S12). If the battery package 50 has been attached (S12: YES), contents of the EEPROM 52 on the battery package side are first read by the ROM reader 37 (S14). Here, a type of the batteries (nickel-metal hydride batteries) and ratings (9.6 V, 3 Ah) are obtained. Next, a map is selected in accordance with the read type of the batteries and ratings (S16). More particularly, various types of maps as explained above with reference to FIG. 5 are stored so that one may be selected that suits the attached battery package. Simultaneously therewith, an open-circuit voltage at the time of 70% capacity (which is in this case 10.4 V) is obtained by retrieving a map (not shown) in accordance with the type of the batteries (nickel-metal hydride batteries) and the nominal voltage (9.6 V), and the 70% capacity (3−0.7=2.1) corresponding to the nominal capacity (3 Ah) is calculated.

Thereafter, it is judged whether the open-circuit voltage of the battery package 50 as measured by the voltage measuring portion 33 is higher than the open-circuit voltage of the 70% capacity (which is in this case 10.4 V)(S18). If the measured open-circuit voltage is higher than 10.4 V (S18: YES), it is judged whether the amount of charge (value of the indicator) as written to the EEPROM 52 of the battery package is 1 or not (S20). If the value of the indicator is not less than 2 (S20: NO), the second indicator 22 is switched ON to indicate that the remaining capacity is not less than 70%. On the other hand, in case the open-circuit voltage is not more than 10.4 V (S18: NO) or in case the open-circuit voltage exceeds 10.4 V but the value of the indicator is 1 (S20: YES), the first indicator 21 as illustrated in FIG. 1 is switched ON to indicate that the remaining capacity is not more than 70%, that is, that charge needs to be performed. In the illustrated embodiment, it is indicated that the battery capacity is a prescribed value or less also in case the battery voltage is higher than the specified value but the amount of charge stored in the EEPROM 52 is small. It is thereby possible to appropriately indicate that the battery capacity is the prescribed value or less even immediately after the battery has been charged for a short time and the battery voltage has thus been temporarily increased.

While the open-circuit voltage of the batteries exhibit slight temperature properties and hysteresis properties for recent hysteresis of charge and discharge, it is in apparent correlation with capacity. It is thereby possible to almost accurately determine whether the remaining capacity of the batteries is more than a specified value or not. Since the battery capacity is determined prior to starting charge in the battery charging device of the illustrated embodiment, it is possible to indicate whether charge is necessary or not to thereby prevent charging battery packages that do not need to be charged, and it is thus enabled to avoid shortening of the life of batteries by repeatedly performing charging them in fully charged conditions and to perform charge a plurality of battery packages at a shortest possible time.

Charging operations will be further explained with reference to FIG. 6. Upon judgment of battery capacity, charge is started (S29). Accompanying the start of charge, adjustments of charge currents and judgment of completion of charge are performed a specified cycles (while the cycle is here set to be every 100 seconds for ease of explanation, each cycle is actually set to be shorter of 10 seconds or less). An absolute temperature T of the nickel-metal hydride batteries is detected (S30). Next, the input absolute temperature T is differentiated for calculating a change in temperature dT/dt of the batteries (S32). An optimal charge current is selected from the above-explained map M1 by referring to FIG. 5 based on the absolute temperature T and change in temperature dT/dt (S34). At an initial stage of charge, both the absolute temperature T and change in temperature dT/dt are low so that a relatively large current is retrieved.

Thereafter, the control portion 36 judges in Steps S36 to S48 whether regions of the final stages of charge have been entered in the map. Upon judging whether a count number has exceeded 10 or not (S50: NO), charge is performed at an optimal charge current value as retrieved in the above Step S34 (S52).

When the final stage of charge is approaching and the battery temperature and values of changes in the battery temperature have entered the regions (region (1) of final stage of charge) I42, I43, I34, I35, I36 that are apt to occur at an initial stage of completion of charge (IN at S36), the counter is increment by "1" (S42). When regions (region (2) of final stage of charge) I51, I52, I53, I44, I45, I46, I54, I55, I56 that are apt to occur at a medium stage of completion of charge are entered (IN at S38), "2" is increment (S44). Further, when regions (region (3) of final stage of charge) I61, I62, I63, I64, I65, I66 that are apt to occur at a final stage of completion of charge are entered (IN at S40), "3" is increment (S46). Upon performing judgment (S54) whether the sum of the counted values exceeds a preliminarily set value (7), if it is detected that the counted value exceeds (7) (S54: NO), 1 is written to the EEPROM 52 of the battery package (S60) as a value for the indicator upon performing Steps S56, 58 and 59.

On the other hand, in case the regions of the final stages of charge are successively entered and the counted value exceeds the set value 7 (S54: YES), the second indicator 22 is switched ON to indicate that charge has been performed up to 70% (S62). Accordingly, 2 is written to the EEPROM 52 of the battery package (S60) as a value for the indicator upon performing Step S59.

On the other hand, the current amounts are integrated from the start of charge (S56) and upon performing judgments whether the integrated value has exceeded the above-calculated value (2.1 Ah)(S58) and if the integrated value has exceeded the calculated capacity (S58: YES), the second indicator 22 is switched ON to indicate that that charge has been performed up to 70% (S62). In other words, the charge capacity is determined in the battery charging device of the illustrated embodiment not only on the map but also on the integrated value of the charge current so that it is possible to reliably display that charge has been performed up to 70%.

In judging whether the sum of counted values exceed the preliminarily set value (10)(S50), if it is judged that the regions of the final stages of charge are successively entered and the counted value exceeds the set value 10 (S50: YES), the third indicator 23 is switched ON to indicate that charge has been completed (S70) and 3 is further written to the EEPROM 52 of the battery package (S72) as a value for the indicator for completing charge (S74).

In the battery charging device of the illustrated embodiment, a permissible current value at which charge may be performed while restricting a rise in temperature of batteries is obtained by using a map that is obtained through mapping temperature values of batteries and values of rises in temperature of batteries. More particularly, a map is retrieved based on temperatures and values of rises in temperature of batteries to obtain a permissible current value at which charge may be performed while restricting a rise in temperature of a battery, and the batteries are charged at the permissible current value. It is accordingly possible to charge batteries, which temperatures are apt to rise at the time of charging, in a short time while causing no degradations owing to rises in temperature.

It is particularly possible to perform accurate determination without being affected through periphery temperatures or the like since it is determined whether the capacity of the batteries is not less than the prescribed value by using the map for determining whether a number of times in which the temperature rising value is relatively high and in which relatively small permissible current values are output is frequent or not, that is, whether the rise in temperature is high and whether the rise in temperature is still being high also when setting a value of charge current to be small.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A battery charging device comprising:
   determining means for determining, prior to start of a charging operation, whether an open-circuit voltage of batteries is higher than a specified value, and
   indicating means for indicating that a capacity of the batteries is not less than a prescribed value in case the battery voltage is determined to be higher than the specified value.

2. A battery charging device comprising:
   an open-circuit voltage obtaining means for obtaining, based on an identifier provided on the battery side, an open-circuit voltage at the time the battery capacity is not less than a specified value,
   determining means for determining, prior to start of a charging operation, whether a measured open-circuit voltage of batteries is higher than the open-circuit voltage as obtained by the open-circuit voltage obtaining means, and
   indicating means for indicating that a capacity of the batteries is not less than a prescribed value in case the measured open-circuit voltage is determined to be higher than the obtained open-circuit voltage.

3. A battery charging device comprising:
   a memory means for storing maps, which are maps that are obtained through mapping based on temperatures and values of rises in temperature of batteries to obtain a permissible current value at which charge may be performed while restricting a rise in temperature of batteries, for setting the permissible current value to be small in case the temperature value is high and setting the permissible current value to be small in case the temperature rising value is low,
   a temperature detecting portion for detecting a present temperature of the batteries,
   a temperature rising value outputting means for obtaining the temperature rising value from the temperature as detected by the temperature detecting portion,
   a permissible current value retrieving portion for retrieving maps in the memory means for obtaining the permissible value based on the temperature as detected by the temperature detecting portion and the temperature rising value output by the temperature rising value outputting means,
   a charging portion for charging the batteries in a charging operation at the permissible current as retrieved by the permissible current value retrieving portion,
   a capacity judging portion for judging during the charging operation whether the batteries have been charged up to a specified capacity on a basis of judgments whether a number of times in which the temperature as detected by the temperature detecting portion and the temperature rising value output by the temperature rising value outputting means fall within regions indicating a final stage of charge from among the map of the memory means is frequent or not, and indicating means for indicating during the charging operation that a capacity of the batteries is not less than a prescribed value based on the judgments of the capacity as obtained by the capacity judging portion.

4. The battery charging device as claimed in claim 1, further comprising an integrating means for integrating charge currents to the batteries, and
   an integrated value judging means for judging whether charge has been performed up to a specified capacity by the integrating means, wherein one of the indicating means indicates that a capacity of the batteries is not less than a prescribed value in case it is judged by the integrated value judging means that charge has been performed up to the specified capacity.

5. The battery charging device as claimed in claim 2, further comprising an integrating means for integrating charge currents to the batteries, and an integrated value judging means for judging whether charge has been performed up to a specified capacity by the integrating means, wherein one of the indicating means indicates that a capacity of the batteries is not less than a prescribed value in case it is judged by the integrated value judging means that charge has been performed up to the specified capacity.

6. The battery charging device as claimed in claim 3, further comprising an integrating means for integrating charge currents to the batteries, and an integrated value judging means for judging whether charge has been performed up to a specified capacity by the integrating means, wherein one of the indicating means indicates that a capacity of the batteries is not less than a prescribed value in case it is judged by the integrated value judging means that charge has been performed up to the specified capacity.

7. A battery charging device comprising:

a charge amount storage means for storing charge amounts to a memory means of the batteries during charging, determining means for determining, prior to start of a charging operation, whether an open-circuit voltage of batteries is higher than a specified value, and indicating means for indicating that a capacity of the batteries is not less than a prescribed value in case the battery voltage is higher than the specified value and a charge amount as stored in the memory means is high, and for indicating that a capacity of the batteries is not more than the prescribed value in case the charge amount as stored in the memory means is low though the battery voltage is higher than the specified value.

* * * * *